Figure 1A:
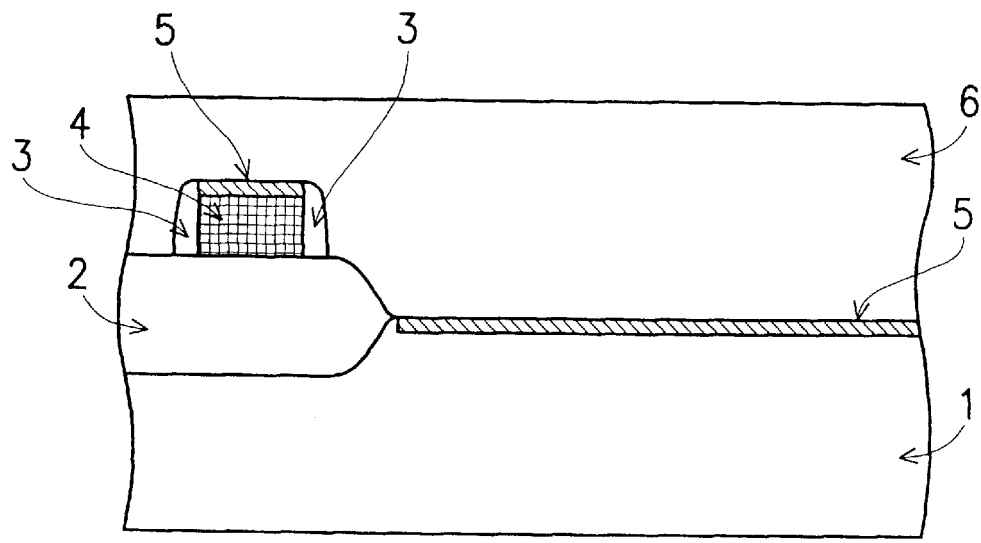

United States Patent [19]
Lin

[11] Patent Number: 5,904,533
[45] Date of Patent: May 18, 1999

[54] METAL SALICIDE-CMP-METAL SALICIDE SEMICONDUCTOR PROCESS

[75] Inventor: Benjamin Szu-Min Lin, Chiayi, Taiwan

[73] Assignee: Winbond Electronics Corp., Hsinchu, Taiwan

[21] Appl. No.: 08/805,419

[22] Filed: Feb. 25, 1997

[30] Foreign Application Priority Data

Feb. 4, 1997 [TW] Taiwan ................................ 86101353

[51] Int. Cl.⁶ .................................................. H01L 21/336
[52] U.S. Cl. ...................... 438/299; 438/682; 438/683; 438/585; 438/592
[58] Field of Search .................... 438/202, 299, 438/682, 683, 585, 592, 581

[56] References Cited

U.S. PATENT DOCUMENTS

| | | | |
|---|---|---|---|
| 4,954,214 | 9/1990 | Ho .............................................. | 156/628 |
| 5,668,024 | 9/1997 | Tsai et al. ................................. | 438/683 |
| 5,682,055 | 10/1997 | Huang et al. ............................ | 257/408 |
| 5,731,239 | 3/1998 | Wong et al. ............................. | 438/296 |
| 5,759,882 | 6/1998 | Kao et al. ................................ | 438/202 |
| 5,759,899 | 6/1998 | Saito ........................................ | 438/683 |
| 5,766,997 | 6/1998 | Takeuchi .................................. | 438/683 |
| 5,804,506 | 9/1998 | Haller et al. ............................. | 438/683 |
| 5,834,368 | 11/1998 | Kawaguchi et al. .................... | 438/581 |

*Primary Examiner*—John F. Niebling
*Assistant Examiner*—Lynne A. Gurley
*Attorney, Agent, or Firm*—Ladas & Parry

[57] ABSTRACT

A metal salicide-CMP-metal salicide semiconductor process, suitable for a semiconductor substrate on which gates, sources (drains), spacers, and field oxides are formed. A first metal layer is formed on gates, sources (drains), spacers, and field oxides. A first high-temperature process is executed to form a first metal salicide layer on gates and sources (drains). A first wet etching is then performed. A first dielectric layer is formed over the semiconductor substrate wherein the horizontal line of the first dielectric layer is above the first metal salicide layer located on gates. A first chemical mechanical polishing (CMP) is then executed until the first metal salicide layer on gates is reached. A second metal layer is formed on the first dielectric layer and on the first metal salicide layer that is located on gates. A second high-temperature process is executed in order to form a thicker second metal salicide layer on the gates. A second wet etching is then performed. A second dielectric layer is formed over the semiconductor substrate. A second chemical mechanical polishing (CMP) is then executed. Finally, shallow contact windows and deep contact windows on gates and sources (drains) respectively are formed.

23 Claims, 6 Drawing Sheets

METAL SALICIDE-CMP-METAL SALICIDE SEMICONDUCTOR PROCESS

BACKGROUND OF THE INVENTION

1. Field of the Invention

The invention relates to a semiconductor process, and, more particularly, to a metal salicide-chemical mechanical polishing (CMP)—metal salicide semiconductor process by which a thicker metal salicide layer is formed on gates to prevent an unacceptable increased gate contact resistance which results from over etching during the etching of shallow contact windows on gates and causes low device efficiencies.

2. Description of the Related Art

Generally, different material layers are formed on a base substrate by depositing and etching in a semiconductor process. As a result, the surface of the substrate on which devices have been already formed is rough, i.e., different positions on the surface of the substrate have different heights. Therefore, etching contact windows having different depths at the same time can not be avoided. In a deep sub-micron semiconductor process, wherein the dimensions of contact windows continue to shrink, Ti self-aligned salicide (Ti salicide) technology is adopted and a chemical mechanical polishing (CMP) method is employed. This results in an increasing severity of the over etching problem that causes material loss inside shallow contact windows during the etching of shallow contact windows.

Figure 1B:
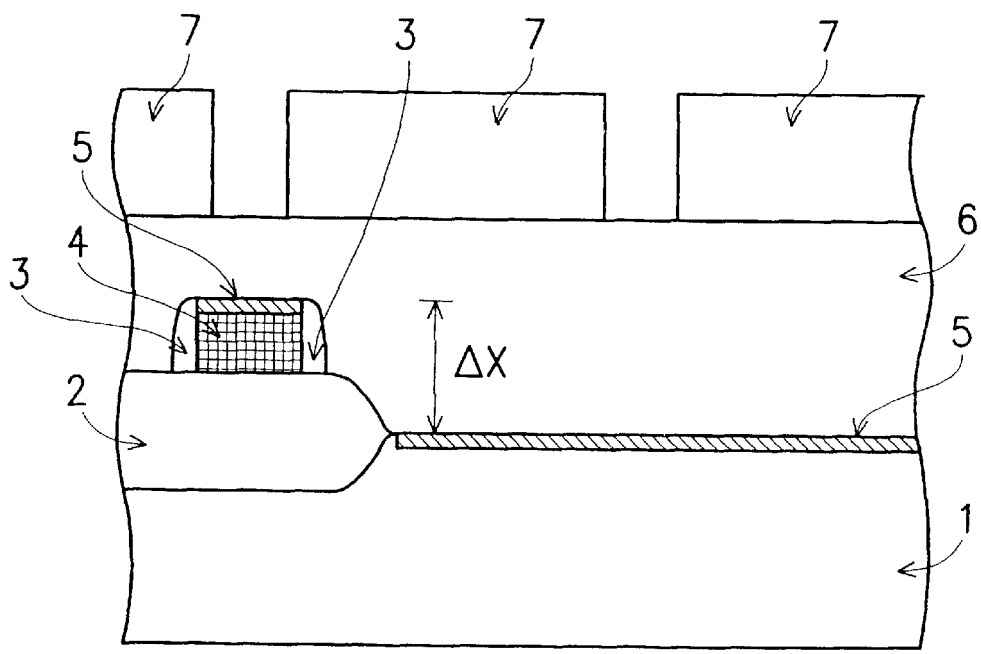
Figure 1C:
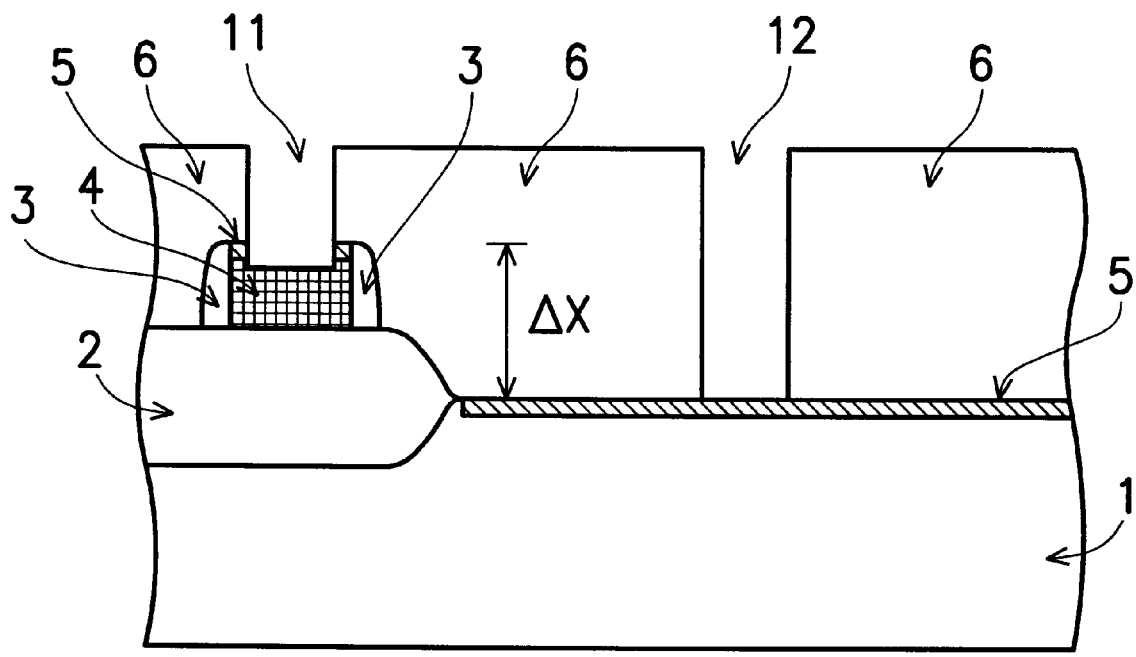

Referring to FIGS. 1A to 1C, a semiconductor wafer contact window process according to the prior art is illustrated. FIG. 1A shows a part of a cross-sectional view of a semiconductor wafer wherein a metal salicide process and a CMP method for planarization have already been completed. Shown are semiconductor substrate 1, field oxide 2, spacers 3, silicon layer 4 (for example, a poly-silicon layer), Ti salicide (TiSi$_2$) layer 5 and interlayer dielectric layer 6.

Referring to FIG. 1B, photoresistor layer 7 is deposited over semiconductor substrate 1 of FIG. 1A and a contact window pattern is defined by a photolithography technology. The result shown in FIG. 1B includes a ΔX distance representing the difference between the depths of two expected contact windows for poly-silicon layer 4 and a source (drain) (not shown), respectively.

Referring next to FIG. 1C, shallow contact window 11 is formed in dielectric layer 6 using anisotropic etching. Due to the two expected contact windows having depth difference ΔX, when Ti salicide layer 5 inside shallow contact window 11 begins to be etched during an etching process, there is still the ΔX thickness in deep contact window 12 left for further etching. Therefore, when deep contact window 12 is etched to the end, Ti salicide layer 5 on poly-silicon layer 4, and even poly-silicon layer 4, are seriously etched, resulting in an unacceptable increased gate contact. Typically, Ti salicide layer 5 on polysilicon layer 4 is thinner and more unstable than that on a single-silicon layer, so the selectivity of interlayer dielectric 6 to Ti salicide layer 5 is not preferable.

SUMMARY OF THE INVENTION

Based on the above, the invention provides a metal salicide-CMP-metal salicide semiconductor process, suitable for a semiconductor substrate on which gates, sources (drains), spacers, and field oxides are already formed. A first metal layer is formed on the gates, sources (drains), spacers, and field oxides. A first high-temperature process is executed to form a first metal salicide layer on the gates, and sources (drains). A first wet etching is then performed. A first dielectric layer is formed over the semiconductor substrate wherein the horizontal line of the first dielectric layer is over the first metal salicide layer located on the gates. A first CMP is executed until the first metal salicide layer on the gates is reached. A second metal layer is formed on the first dielectric layer and on the first metal salicide layer that is located on the gates. A second high-temperature process is performed in order to form a thicker second metal salicide layer on the gates. A second wet etching is then executed. A second dielectric layer is formed over the semiconductor substrate. A second CMP is then performed. Finally, shallow contact windows and deep contact windows are formed for the gates and sources (drains), respectively. The above-mentioned second metal salicide layer formed on the gates is thicker, thereby preventing an unacceptable increased gate contact resistance resulting from over etching during the etching of shallow contact windows for the gates and causing low device efficiencies.

DETAILED DRAWINGS OF THE INVENTION

The objects, characteristics, and advantages of the present invention will be explained clearly by using a preferred embodiment with pertinent drawings as follows:

FIGS. 1A to 1C are cross-sectional views showing a prior art contact window process; and FIGS. 2A to 2H are cross-sectional views showing a metal salicide-CMP-metal salicide semiconductor process for etching contact windows according to an embodiment of the invention.

DETAILED EMBODIMENT OF THE INVENTION

Figure 2A:
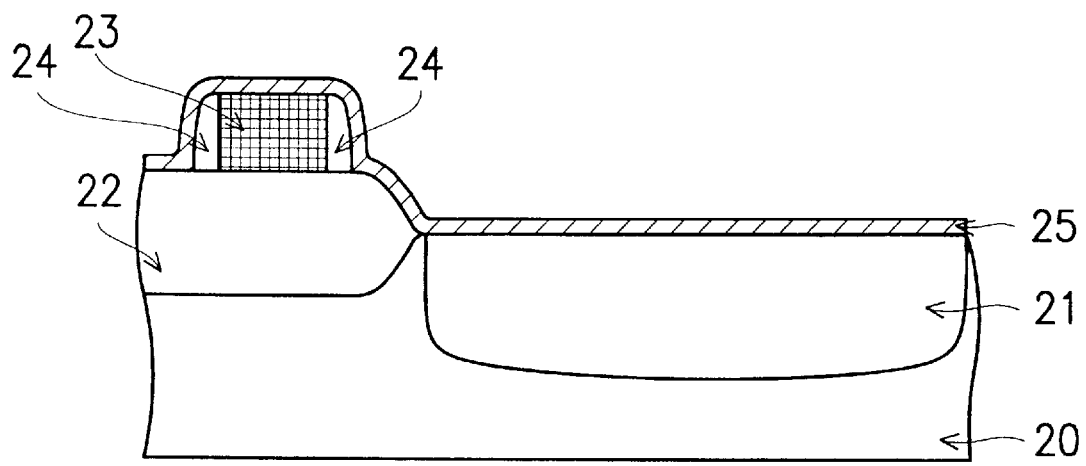

Referring to FIG. 2A, the present invention relates to a metal salicide-CMP-metal salicide semiconductor process, suitable for semiconductor substrate 20 on which gate 23, source (drain) 21, spacers 24, and field oxide 22, are already formed. The process includes the following steps:

Step 1

Still referring to FIG. 2A, first Ti metal layer 25 is formed on gate 23, source (drain) 21, spacers 24, and field oxide 22 by using a chemical vapor deposition (CVD) method.

Step 2

Figure 2B:
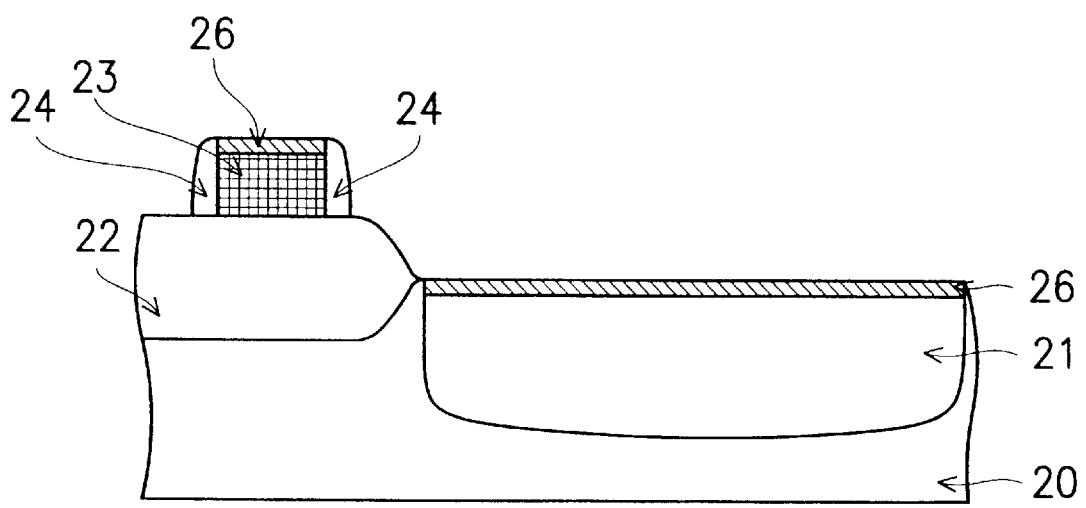

Referring to FIG. 2B, a first high temperature process, for example, a rapid thermal process (RTP), is executed in order to form first Ti metal salicide layer 26 on gate 23 and source (drain) 21, then a first wet etching is executed in order to remove a part of first Ti metal layer 25 that does not join a silicide reaction.

Step 3

Figure 2C:
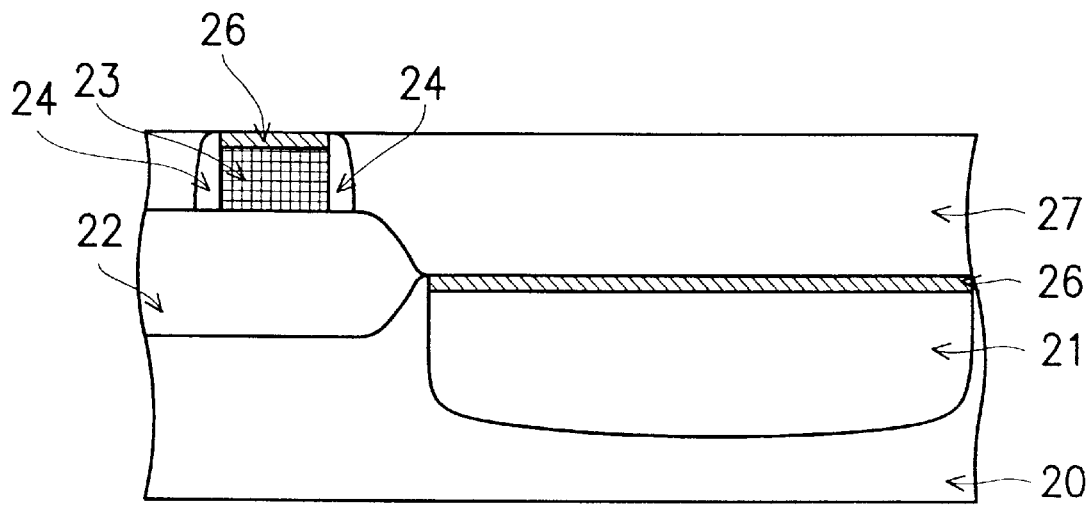

Referring to FIG. 2C, first oxide layer 27 is formed over semiconductor substrate 20 by using a chemical vapor deposition (CVD) method wherein the horizontal line of first oxide layer 27 is over first Ti salicide layer 26 located on gate 23. Then a first chemical mechanical polishing (CMP) is performed until first Ti salicide layer 26 on gate 23 is reached by means of first Ti salicide layer 26 having a different polishing rate.

Step 4

Figure 2D:
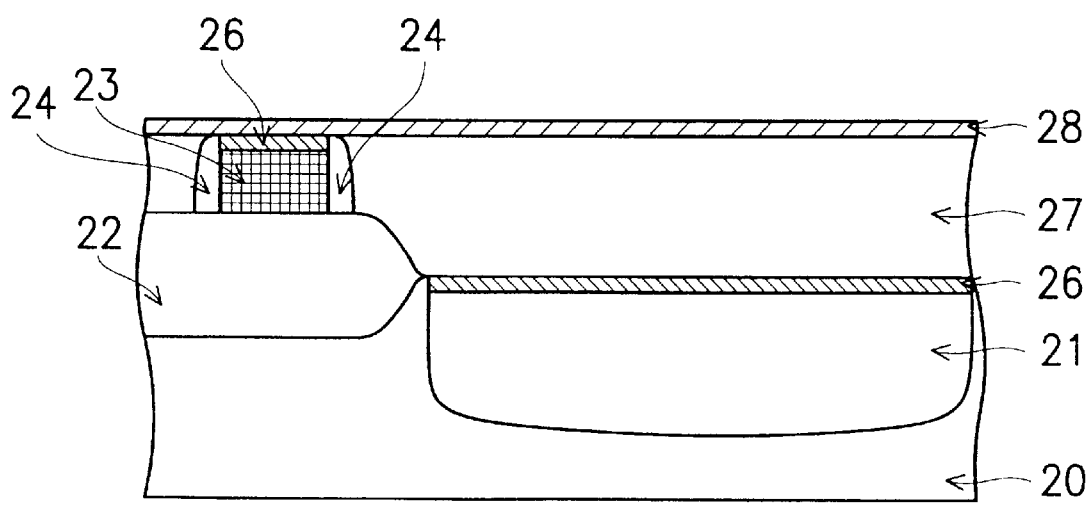

Referring to FIG. 2D, second Ti metal layer 28 is formed on first Ti salicide 26 located on gate 23 and on first oxide layer 27 by using a chemical vapor deposition (CVD) method.

Step 5

Figure 2E:
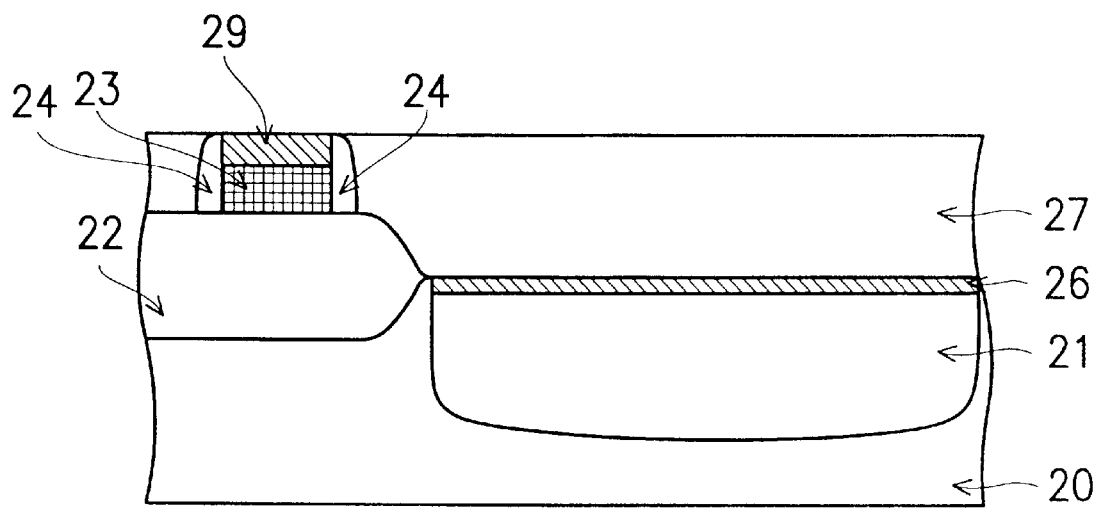

Referring to FIG. 2E, a second high-temperature process, for example, a rapid thermal process (RTP), is executed in order to form thicker second Ti salicide layer 29 on gate 23. Then a second wet etching is performed to remove a part of second Ti metal layer 28 that does not join a silicide reaction.

Step 6

Figure 2F:
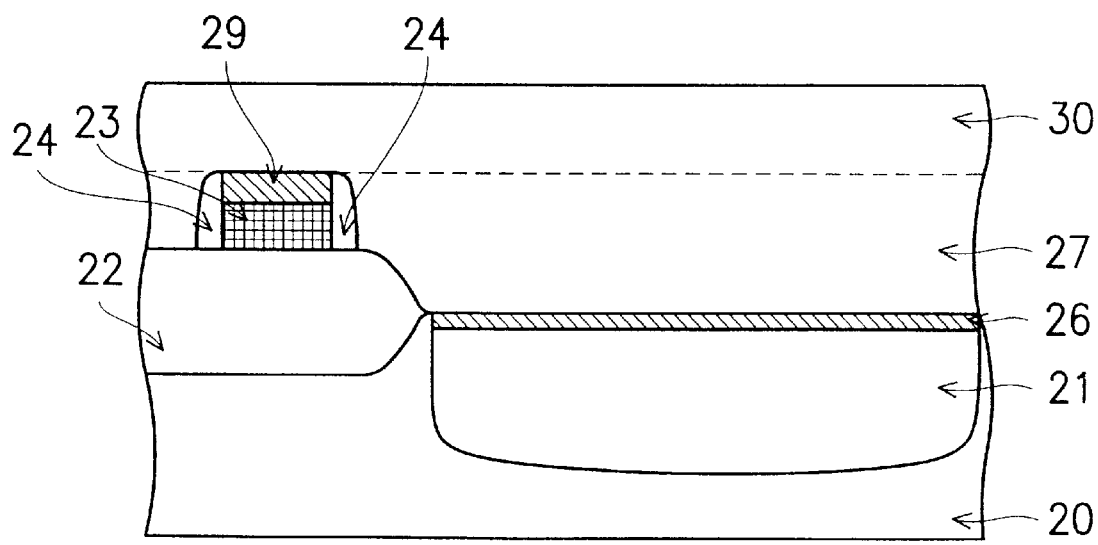

Referring to FIG. 2F, second oxide layer 30 is formed over semiconductor substrate 20 by using a chemical vapor deposition (CVD) method. Then, a second chemical mechanical polishing (CMP) is executed.

Step 7

Figure 2G:
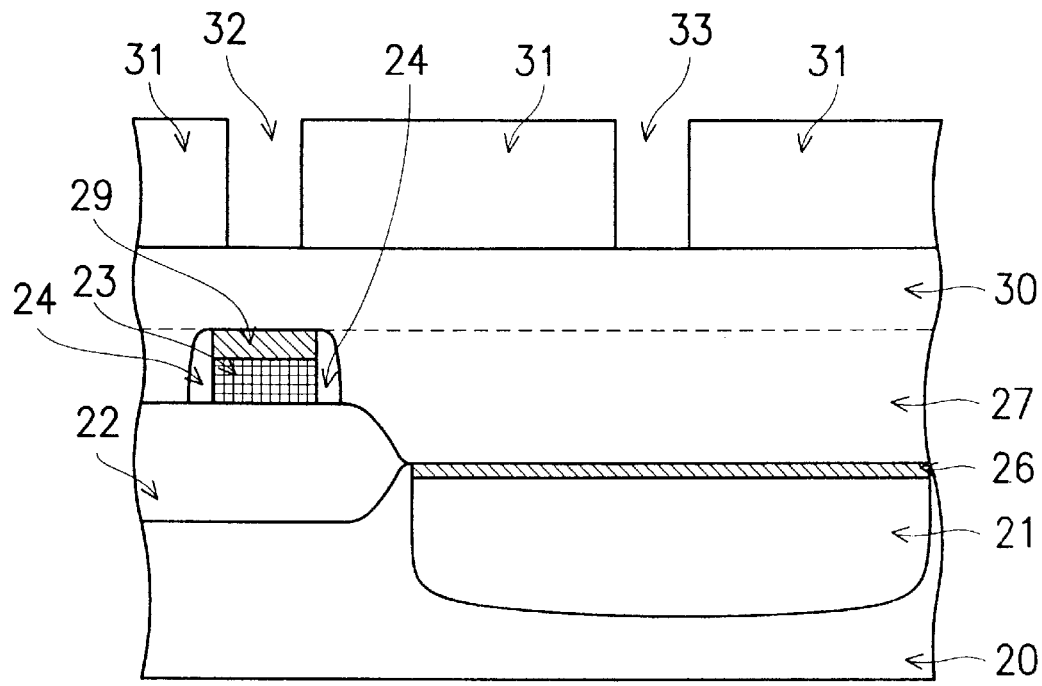

Referring to FIG. 2G, photoresistor layer 31 is formed on second oxide layer 30. Then first trench 32 and second trench 33 are formed by using a photolithography technology.

Step 8

Figure 2H:
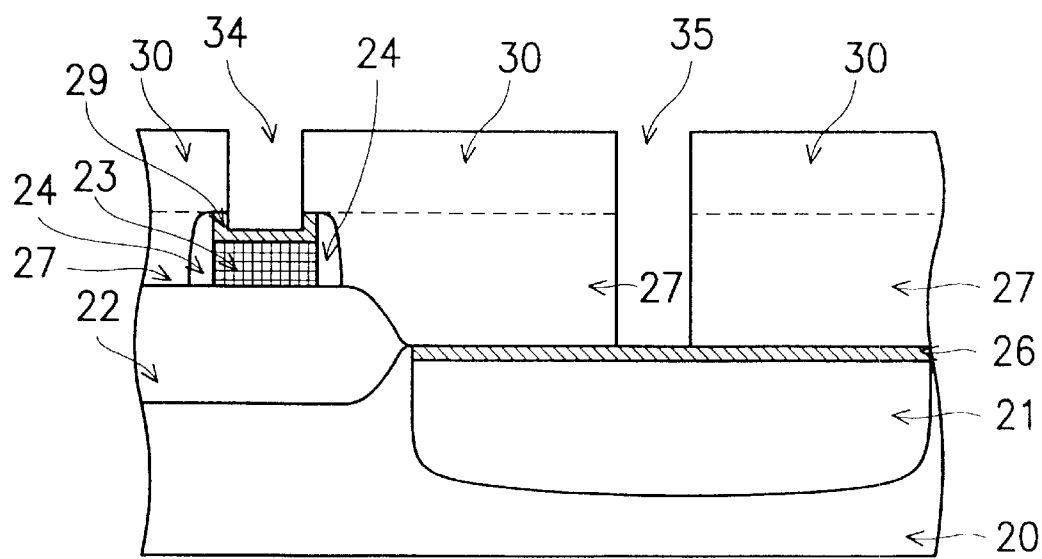

Referring to FIG. 2H, shallow contact window 34 and deep contact window 35 are formed for gate 23 and source (drain) 21, respectively, by using an anisotropic plasma etching.

Based on the metal salicide-CMP-metal salicide semiconductor process according to an embodiment of the invention, thicker second Ti salicide layer (TiSi$_2$) 29 formed can prevent itself, and even gate 23, from over etching resulting in an unacceptable increased gate contact resistance that causes low device efficiencies.

Although the invention has been disclosed in terms of a preferred embodiment, the disclosure is not intended to limit the invention. Those knowledgeable in the art can make modifications within the scope and spirit of the invention that is determined by the claims below.

What is claimed is:

1. A metal salicide-CMP-metal salicide semiconductor process operable on a semiconductor substrate on which a plurality of gates, sources (drains), spacers, and field oxides are already formed, comprising:

forming a first metal layer on said gates, sources (drains), spacers, and field oxides;

executing a first high-temperature process to form a first metal salicide layer on said gates and sources (drains);

executing a first wet etching;

forming a first dielectric layer over said semiconductor substrate wherein a horizontal line of said first dielectric layer is above said first metal salicide layer located on said gates;

executing a first polishing until said first metal salicide on said gates is reached;

forming a second metal layer on said first dielectric layer and said first metal salicide layer which is located on said gates;

executing a second high-temperature process to form a thicker second metal salicide layer on said gates; and executing a second wet etching.

2. The metal salicide-CMP-metal salicide semiconductor process of claim 1, after executing said second wet etching, further comprising:

forming a second dielectric layer over said semiconductor substrate;

executing a second polishing; and forming a plurality of shallow contact windows and deep contact windows for said gates and sources (drains), respectively.

3. The metal salicide-CMP-metal salicide semiconductor process of claim 1 wherein said first metal layer is a Ti metal layer.

4. The metal salicide-CMP-metal salicide semiconductor process of claim 1 wherein said first metal layer is formed by using a chemical vapor deposition (CVD) method.

5. The metal salicide-CMP-metal salicide semiconductor process of claim 1 wherein said second metal layer is a Ti metal layer.

6. The metal salicide-CMP-metal salicide semiconductor process of claim 1 wherein said second metal layer is formed by a chemical vapor deposition (CVD) method.

7. The metal salicide-CMP-metal salicide semiconductor process of claim 1 wherein said first high-temperature process is a rapid thermal process (RTP).

8. The metal salicide-CMP-metal salicide semiconductor process of claim 1 wherein said second high-temperature is a rapid thermal process (RTP).

9. The metal salicide-CMP-metal salicide semiconductor process of claim 1 wherein said first metal salicide layer is a Ti metal salicide layer.

10. The metal salicide-CMP-metal salicide semiconductor process of claim 1 wherein said second metal salicide layer is a Ti metal salicide layer.

11. The metal salicide-CMP-metal salicide semiconductor process of claim 1 wherein said first metal salicide layer is formed by using said first high-temperature process to induce a first silicide reaction.

12. The metal salicide-CMP-metal salicide semiconductor process of claim 1 wherein said second metal salicide layer is formed by using said second high-temperature process to induce a second silicide reaction.

13. The metal salicide-CMP-metal salicide semiconductor process of claim 11 wherein said first wet etching is executed to remove a part of said first metal layer which does not join said first silicide reaction.

14. The metal salicide-CMP-metal salicide semiconductor process of claim 12 wherein said second wet etching is executed to remove a part of said second metal layer which does not join said second silicide reaction.

15. The metal salicide-CMP-metal salicide semiconductor process of claim 1 wherein said first polishing is executed until said first metal salicide layer on said gates is reached by means of said first metal salicide layer having a different polishing rate.

16. The metal salicide-CMP-metal salicide semiconductor process of claim 1 wherein said first dielectric layer is an oxide layer.

17. The metal salicide-CMP-metal salicide semiconductor process of claim 1 wherein said first dielectric layer is formed by using a chemical vapor deposition (CVD) method.

18. The metal salicide-CMP-metal salicide semiconductor process of claim 1 wherein said first polishing is a chemical mechanical polishing (CMP).

19. The metal salicide-CMP-metal salicide semiconductor process of claim 2 wherein said second dielectric layer is an oxide layer.

20. The metal salicide-CMP-metal salicide semiconductor process of claim 2 wherein said second dielectric layer is formed by using a chemical vapor deposition (CVD) method.

21. The metal salicide-CMP-metal salicide semiconductor process of claim 2 wherein said shallow contact windows and said deep contact windows are formed by using a photolithography technology and a plasma etching method.

22. The metal salicide-CMP-metal salicide semiconductor process of claim 21 wherein said plasma etching is an anisotropic etching.

23. The metal salicide-CMP-metal salicide semiconductor process of claim 2 wherein said second polishing is a chemical mechanical polishing (CMP).

* * * * *